(12) United States Patent
Ozawa (10) Patent No.: US 8,466,698 B2
(45) Date of Patent: Jun. 18, 2013

(54) CURRENT SENSOR

(75) Inventor: Jyun Ozawa, Chiryu (JP)

(73) Assignee: Denso Corporation, Kariya (JP)

( * ) Notice: Subject to any disclaimer, the term of this patent is extended or adjusted under 35 U.S.C. 154(b) by 331 days.

(21) Appl. No.: 13/035,433

(22) Filed: Feb. 25, 2011

(65) Prior Publication Data

US 2011/0241649 A1    Oct. 6, 2011

(30) Foreign Application Priority Data

Feb. 26, 2010  (JP) ................. 2010-041590

(51) Int. Cl.
*G01R 27/08* (2006.01)
*G01R 19/00* (2006.01)

(52) U.S. Cl.
USPC ........... 324/713; 324/691; 324/76.11; 702/64

(58) Field of Classification Search
USPC ............. 324/76.11, 522, 713, 691, 649, 600, 324/348, 347, 354; 702/64, 57, 1
See application file for complete search history.

(56) References Cited

U.S. PATENT DOCUMENTS

| | | | |
|---|---|---|---|
| 7,746,027 B2 * | 6/2010 | Imamura et al. | 320/104 |
| 7,835,156 B2 * | 11/2010 | Kubokawa et al. | 361/760 |
| 2005/0200202 A1 * | 9/2005 | Mihara | 307/10.1 |
| 2008/0030208 A1 | 2/2008 | Aratani | |
| 2008/0224544 A1 * | 9/2008 | Koyama | 307/104 |
| 2009/0200993 A1 | 8/2009 | Maeda | |
| 2011/0050249 A1 * | 3/2011 | Maeda | 324/649 |

FOREIGN PATENT DOCUMENTS

| | | |
|---|---|---|
| JP | A-5-273321 | 10/1993 |
| JP | A-2008-39571 | 2/2008 |
| JP | A-2009-184639 | 8/2009 |

* cited by examiner

*Primary Examiner* — Hoai-An D Nguyen
(74) *Attorney, Agent, or Firm* — Oliff & Berridge, PLC (57) ABSTRACT

A current sensor, which senses current passing through a harness via a terminal of a battery, includes a resistor through which current passes, a current sensing circuit which measures the current passing through the resistor based on a potential difference between two positions along the direction in which current is passed through the resistor, a power supply circuit which supplies power to the current sensing circuit, and at least one capacitor which is connected to at least one of an input terminal and an output terminal of the power supply circuit to smooth input/output voltage. The resistor includes a flat energizing path, and the capacitor is disposed in an area other than a plane of projection of the energizing path on a board on which the current sensing circuit and the power supply circuit are mounted.

5 Claims, 6 Drawing Sheets

CURRENT SENSOR

CROSS-REFERENCE TO RELATED APPLICATION

This application is based on and claims the benefit of priority from earlier Japanese Patent Application No. 2010-41590 filed Feb. 26, 2010, the description of which is incorporated herein by reference.

BACKGROUND

1. Technical Field

The present invention relates to a current sensor that senses charge/discharge current of a battery installed such as in a passenger car or a truck.

2. Related Art

Conventionally, current sensors have been known in which a current sensing circuit housed in a case is provided at a middle portion in the longitudinal direction of a flat bus bar. In JP-A-2008-39571, a current sensing circuit is disposed so as to be opposed to a shunt resistor. The current sensing circuit senses the voltage across the shunt resistor to measure the charge/discharge current of a battery.

As described above, the current sensor disclosed in JP-A-2008-39571 has the current sensing circuit disposed so as to be opposed to the shunt resistor. Hence, when the current sensing circuit or peripheral circuits thereof have an electrolytic capacitor, eddy current is generated on an electrode, which has a large area, of the electrolytic capacitor due to a magnetic field generated when a high current passes through the shunt resistor. Accordingly, the current sensor is subject to noise and is likely to decrease reliability due to malfunction thereof.

SUMMARY

An embodiment provides a current sensor in which the effects of noise on a capacitor can be reduced, whereby reliability thereof is prevented from decreasing due to malfunction thereof.

As an aspect of the embodiment, a current sensor, which senses current passing through a harness via a terminal of a battery, includes: a resistor through which current passes; a current sensing circuit which measures the current passing through the resistor based on a potential difference between two positions along the direction in which current is passed through the resistor; a power supply circuit which supplies power to the current sensing circuit; and at least one capacitor which is connected to at least one of an input terminal and an output terminal of the power supply circuit to smooth input/output voltage. The resistor includes a flat energizing path, and the capacitor is disposed in an area other than a plane of projection of the energizing path on a board on which the current sensing circuit and the power supply circuit are mounted.

BRIEF DESCRIPTION OF THE DRAWINGS

In the accompanying drawings.

DETAILED DESCRIPTION OF THE PREFERRED EMBODIMENTS

With reference to the accompanying drawings, hereinafter is described an embodiment of a current sensor. The current sensor of the embodiment is mounted on, for example, a vehicular lead battery and is used for sensing the charge/discharge current of the battery.

Figure 1:
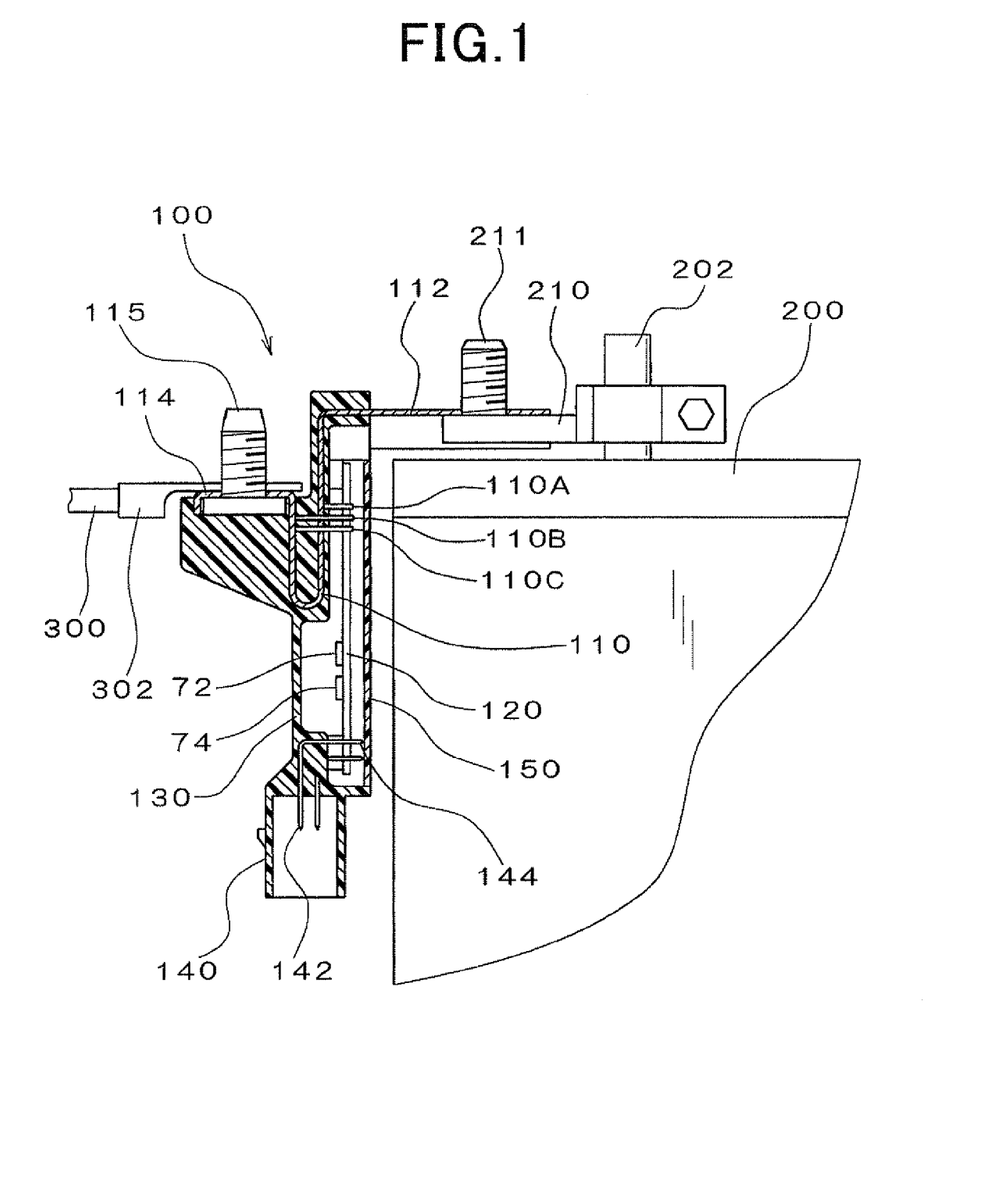
FIG. 1 is a cross-sectional view illustrating a configuration of a current sensor according to an embodiment.
Figure 2:
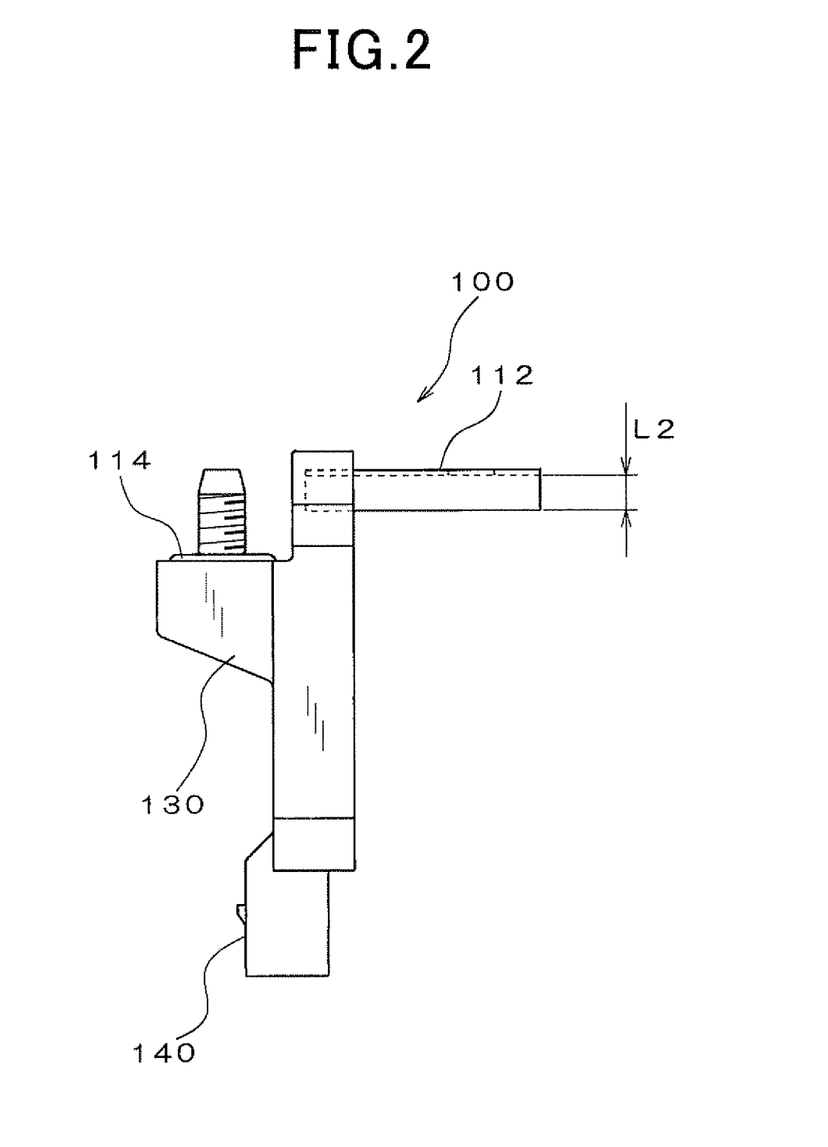
FIG. 2 is a side view illustrating the current sensor.
Figure 3:
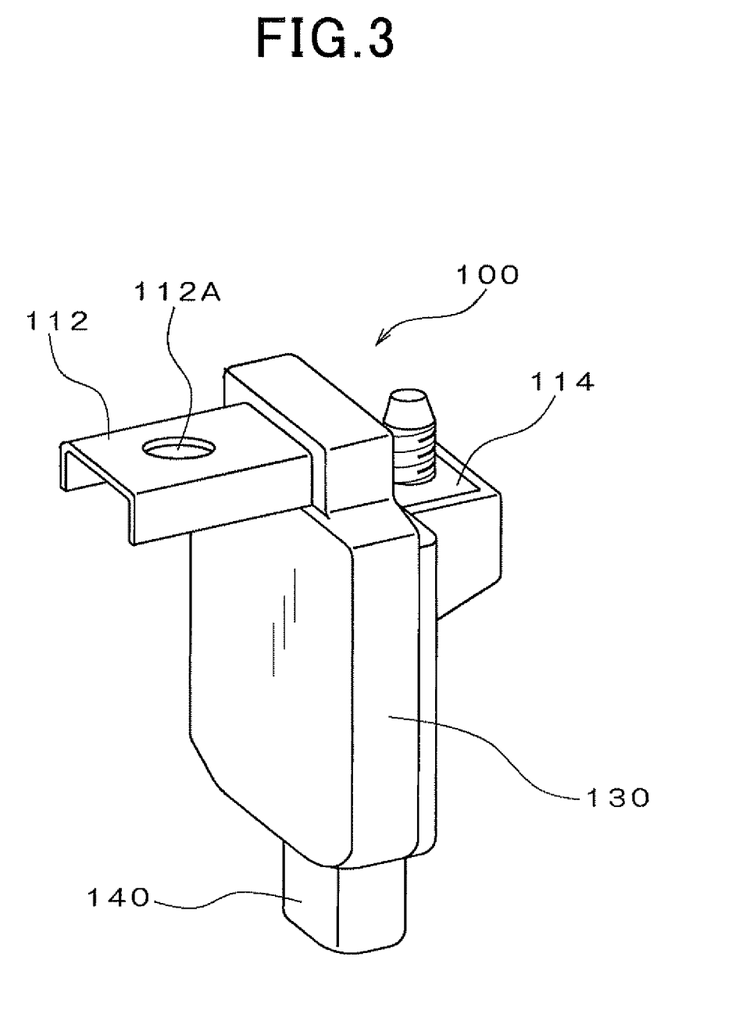
FIG. 3 is a perspective view illustrating the current sensor.

FIG. 1 is a cross-sectional view illustrating a configuration of a current sensor 100 according to the embodiment. FIG. 1 shows a state where the current sensor 100 is attached to a battery of a motor vehicle. FIG. 2 is a side view illustrating the current sensor 100 and FIG. 3 is a perspective view illustrating the current sensor 100.

As shown in these figures, the current sensor 100 of the present embodiment includes a bus bar 110, a circuit board 120, a case 130, a connector 140 and a cover 150. The bus bar 110 is made of an electrically conductive material and serves as a resistor (shunt resistor). The circuit board 120 is mounted with a current sensing circuit which measures current passing through the bus bar 110 based on a potential difference between two positions along the direction in which current is passed through the bus bar 110. The case 130 accommodates the bus bar 110 and the circuit board 120. The connector 140 is provided with a plurality of connector terminals 142 exposed inside thereof to establish electrical connection between the connector 140 and the circuit board 120. The cover 150 covers an opening of a recess formed inside the case 130 in which the circuit board 120 is accommodated.

The bus bar 110 is bent in the case 130 so as to have a U-shaped form. The bus bar 110 has one end which is fixed to wiring on the side of a battery 200 to form a first fixed part 112 for establishing electrical connection. The bus bar 110 has the other end to which a harness is fixed to form a second fixed part 114 for establishing electrical connection. The bus bar 110 is formed by pressing one plate member into shapes.

In the present embodiment, an approximately rectangular parallelepiped case 130 is disposed in the vicinity of a side surface of the battery 200 (side surface nearest to a terminal 202 of the battery 200 to which the current sensor 100 is fixed) so that the longitudinal direction thereof is parallel to the side surface of the battery 200. Specifically, the case 130 is disposed so that internal space of the case 130 and a circuit board 120 accommodated therein are perpendicular to the ground. The first fixed part 112 and the second fixed part 114 project in the opposite horizontal directions from the longitudinally elongated case 130.

The first fixed part 112 has a U-shaped cross section turned sideways. The first fixed part 112 having the U-shaped cross section has a bottom surface at a portion of which a through hole 112A (see FIG. 3) is formed. As shown in FIG. 1, a metal bracket 210 is attached to the negative terminal 202 of the battery 200 to attach the current sensor 100 thereto. The metal bracket 210 also serves as wiring between the negative terminal 202 and the first fixed part 112. The metal bracket 210 has an end portion from which a bolt 211 is projected upward. In the present embodiment, the bolt 211 of the metal bracket 210 is inserted into the through hole 112A of the U-shaped first fixed part 112 from the side of an opening of a recess of the U-shaped first fixed part 112. The inserted bolt 211 is tightened up with a nut (not shown) for fixation of the first fixed part 112 to the metal bracket 210.

The second fixed part 114 has an end portion in the vicinity of which a through hole is provided, with a bolt 115 being inserted therethrough. The second fixed part 114 is electrically connected with a harness 300 having an end portion which is provided with a terminal 302 having a through hole. The bolt 115 provided at the second fixed part 114 is inserted into the through hole of the terminal 302 to tighten the terminal 302 with a nut (not shown), so that the terminal 302 is fixed to the second fixed part 114.

In the present embodiment, the case 130 is made of a resin material having good insulation properties and high heat conductivity, such as PPS (polyphenylene sulfide) resin. Most part of the bus bar 110 is insert-molded with the resin except the portion exposed outside as the first fixed part 112 or the second fixed part 114.

A current sensing terminal 110A and a sensing ground terminal 110B extend from two positions of the bus bar 110, which are distanced from each other with a U-shaped turned portion of the bus bar 110 being interposed therebetween, to the side of the circuit board 120. The current sensing terminal 110A and the sensing ground terminal 110B serve as electrodes for measuring a potential difference between the two positions. The current sensing terminal 110A and the sensing ground terminal 110B are simultaneously formed when pressing a plate member made of an electrically conductive material (metallic material) into shapes to form the bus bar 110. Thereafter, when the plate member is bent into a U-shape, or after the plate member is bent, the current sensing terminal 110A and the sensing ground terminal 110B are bent toward the side of the circuit board 120. Note that, in the present embodiment, a circuit ground terminal 110c is extended from a position substantially the same as that of the sensing ground terminal 110B. The circuit ground terminal 110c is provided in addition to the sensing ground terminal 110B to suppress variations of the potential difference of the sensing ground terminal 110B as much as possible when circuits mounted on the circuit board 120 operate. The three terminals (current sensing terminal 110A, sensing ground terminal 110B, circuit ground terminal 110c) extending from the bus bar 110 are connected to the current sensing circuit in the circuit board 120 by, for example, soldering.

In the present embodiment, the circuit board 120 is mounted with, in addition to the current sensing circuit, a power supply circuit and a capacitor. The power supply circuit supplies operating power to the current sensing circuit. At least one capacitor is connected to at least one of an input terminal and an output terminal of the power supply circuit to smooth input/output voltage.

Figure 4:
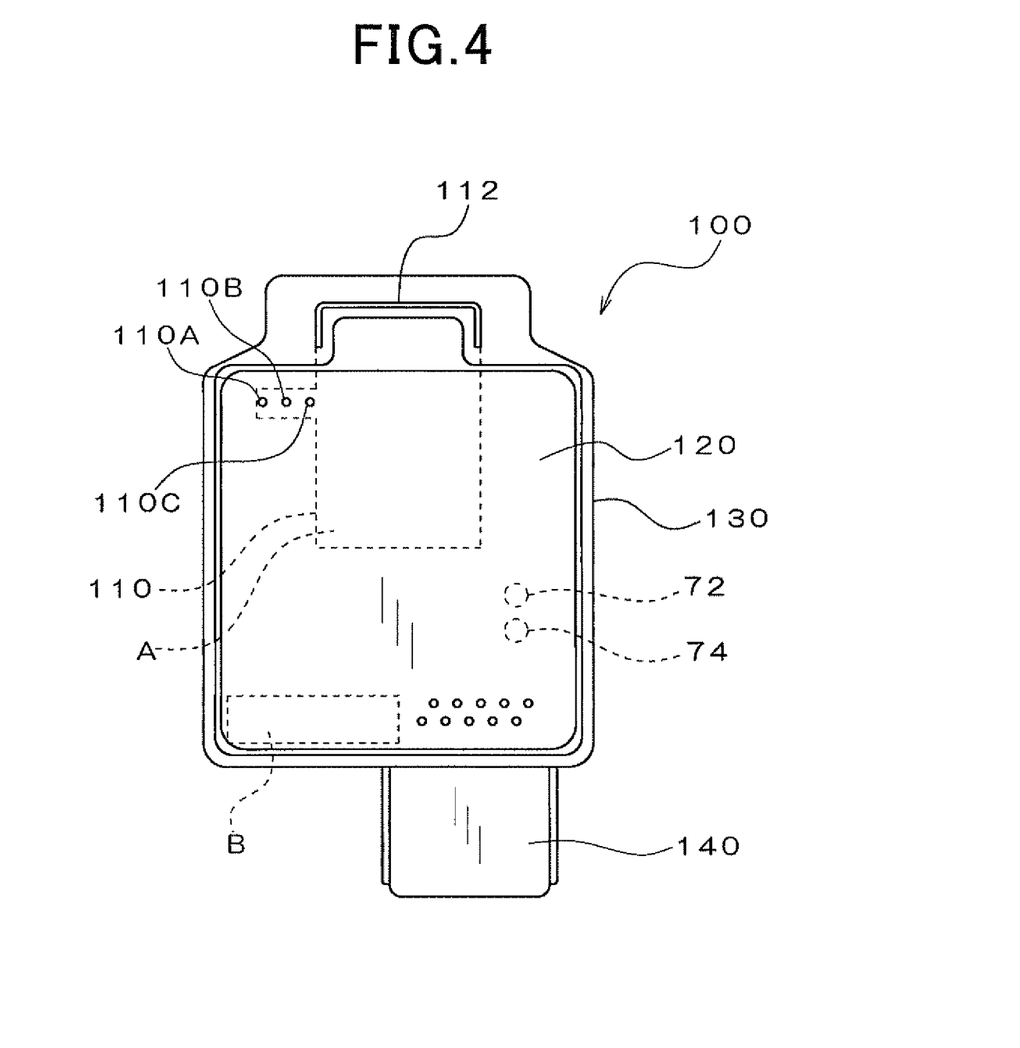
FIG. 4 is a diagram showing an arrangement of capacitors in the current sensor.
Figure 5:
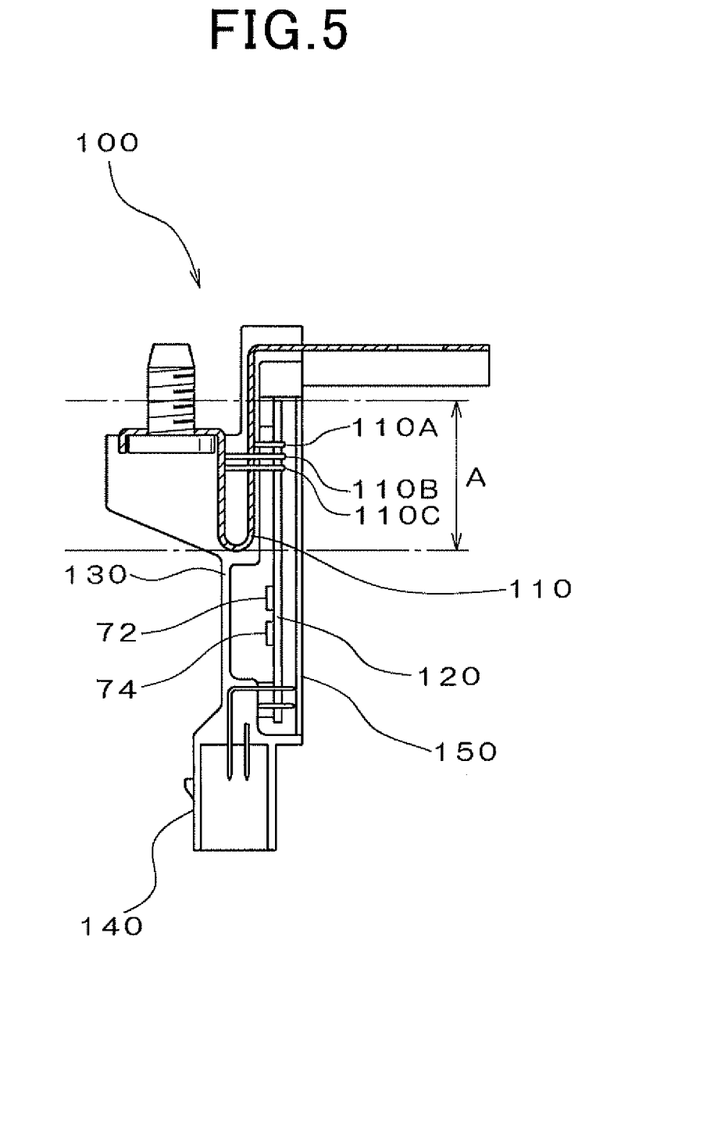
FIG. 5 is a diagram showing an arrangement of capacitors in the current sensor.

FIGS. 4 and 5 are diagrams showing an arrangement of capacitors in the current sensor 100. As shown in FIGS. 4 and 5, the bus bar 110 serving as a resistor has a flat (flat plate shaped) energizing path. The is capacitors 72 and 74 are disposed in an area other than the plane of projection (In FIGS. 4 and 5, the area corresponding to the plane of projection is indicated by "A") of the energizing path on the circuit board 120 on which the current sensing circuit and the power supply circuit are mounted. Note that the projection direction to the plane of projection is perpendicular to the surface of the bus bar 110 opposed to the circuit board 120. The current sensing circuit is disposed in the vicinity of the current sensing terminal 110A and the sensing ground terminal 110B so as to be located in the area "A" shown in FIG. 5. In other words, the capacitors 72 and 74 are disposed in an area other than the area between the bus bar 110 and the current sensing circuit.

In addition, the capacitors 72 and 74 are disposed on one surface of the circuit board 120, that is, at the side at which the bus bar 110 is disposed. Since the capacitors 72 and 74 are disposed in an area which does not overlap with the bus bar 110, the thickness of the case 130 can be prevented from increasing as much as possible in the direction in which the bus bar 110 and the circuit board 120 are laid side by side.

Figure 6:
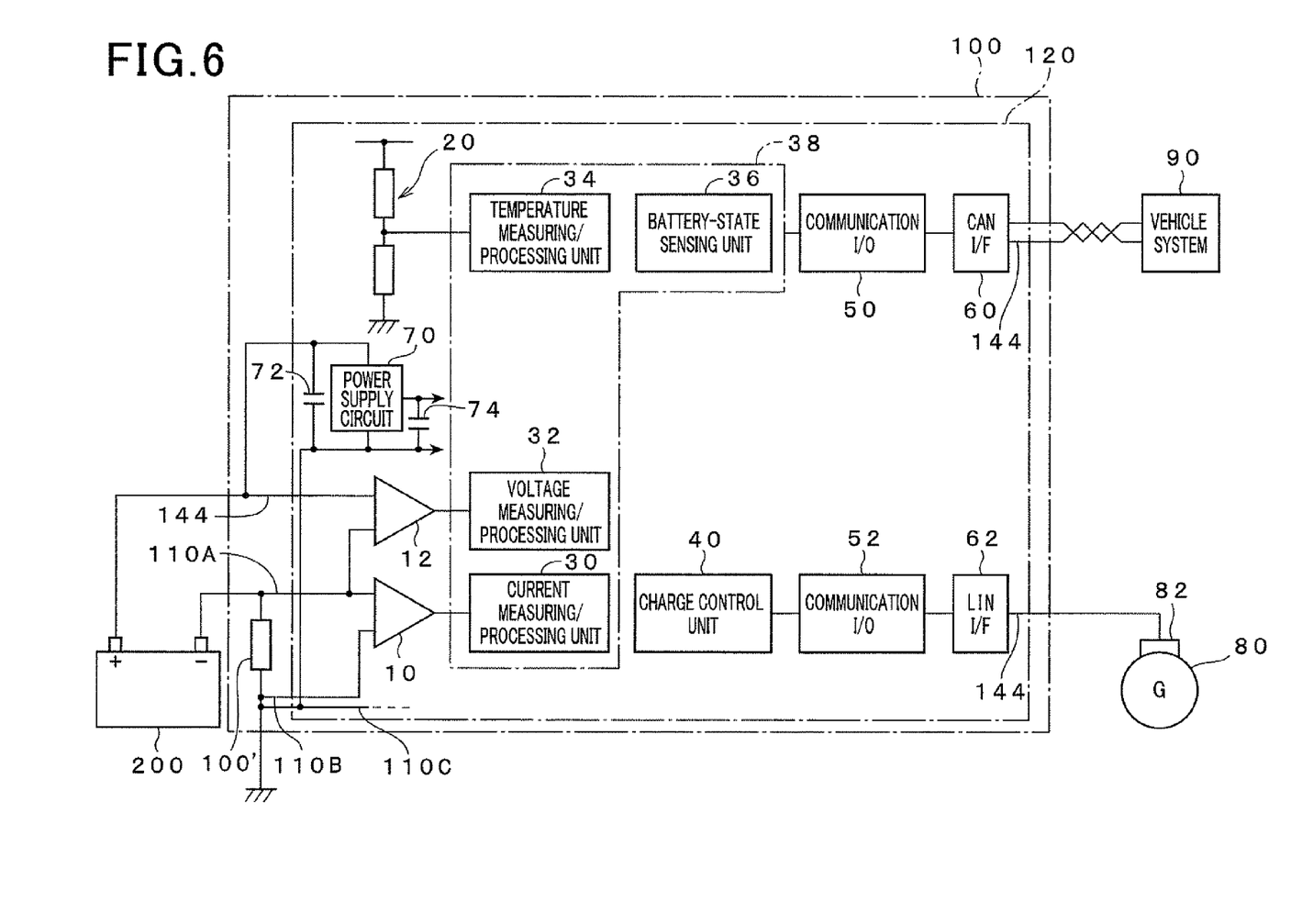
FIG. 6 is a block diagram illustrating a specific example of a circuit of the current sensor and an example of connecting the circuit such as to a battery.

FIG. 6 is a block diagram illustrating a specific example of a circuit of the current sensor 100 and an example of connecting the circuit such as to the battery 200. As shown in FIG. 6, the current sensor 100 is provided with the circuit board 120 that includes differential amplifiers 10 and 12, a temperature sensor 20, a current measuring/processing unit 30, a voltage measuring/processing unit 32, a temperature measuring/processing unit 34, a battery-state sensing unit 36, a charge control unit 40, communication input/output units (communication I/O) 50 and 52, a CAN interface (CAN I/F) 60, a LIN interface (LIN I/F) 62, a power supply circuit 70, and the capacitors 72 and 74. The differential amplifier 10 is connected to both ends of a shunt resistor 110' which is formed with a part of the bus bar 110 and serves as a resistive element. The differential amplifier 12 is connected to the positive terminal and the negative terminal of the battery 200. The CAN I/F 60 transmits/receives data according to a CAN (controller area network) protocol. The LIN I/F 62 transmits/receives data according to a LIN (local interconnect network) protocol.

The differential amplifier 10 amplifies the voltage across the shunt resistor 100'. The current measuring/processing unit 30 measures current passing through the shunt resistor 100' based on the output voltage of the differential amplifier 10. The differential amplifier 12 converts the voltage across the battery 200 (battery voltage) into a voltage of a proper level. The voltage measuring/processing unit 32 measures the battery voltage based on the output voltage of the differential amplifier 12.

The temperature sensor 20 is configured with a voltage divider circuit including a resistor and a thermistor. The resistance value of the thermistor varies according to the temperature, whereby divided voltage of the voltage divider circuit varies. The temperature measuring/processing unit 34 measures the temperature of the current sensor 100 (temperature of the battery 200) based on the output voltage (divided voltage) of the temperature sensor 20. The battery-state sensing unit 36 obtains measurement values from the current measuring/processing unit 30, the voltage measuring/processing unit 32 and the temperature measuring/processing unit 34 to produce a battery-state signal. A battery-state sensor 38 is configured by the current measuring/processing unit 30, the voltage measuring/processing unit 32, the temperature measuring/processing unit 34 and the battery-state sensing unit 36.

The charge control unit 40 controls the state of electric generation of the vehicle generator (G) 80 based on the battery-state signal produced by the battery-state sensing unit 36. This electric generation control is performed by transmitting an instruction from the charge control unit 40 to a generation controller 82 installed in the vehicle generator 80 via the communication I/O 52 and the LIN I/F 62. The battery-state signal produced by the battery-state sensing unit 36 is transmitted to a vehicle system 90 via the communication I/O 50 and the CAN I/F 60. The vehicle system 90 integrally controls the engine and various electrical loads based such as on the received battery-state signal.

The current sensing circuit is configured with the differential amplifier 10 and the current measuring/processing unit 30. The power supply circuit 70 is connected to the positive terminal and the negative terminal of the battery 200. The power supply circuit 70 supplies operating power to the current sensing circuit and other circuits mounted on the circuit board 120. The capacitor 72 is connected between input terminals of the power supply circuit 70 at the side to which the battery 200 is connected. The capacitor 74 is connected between output terminals of the power supply circuit 70 at the side to which the current sensing circuit and the like are connected. The capacitor 72 smoothes the input voltage of the power supply circuit 70. The capacitor 74 smoothes the output voltage of the power supply circuit 70. As the capacitors 72 and 74, for example, electrolytic capacitors are used.

As described above, in the current sensor 100 according to the embodiment, the capacitors 72 and 74 are disposed in an area other than the plane of projection of the energizing path of the bus bar 110 serving as a resistor. According to the configuration, the effects of the magnetic field, which is generated when a high current passes through the bus bar 110, on the capacitors 72 and 74 can be reduced. Reliability of the current sensor 100 can be prevented from decreasing due to malfunction of the current sensing circuit or the like connected to the power supply circuit 70. In addition, since the effects of the temperature of the bus bar 110 increased when a high current passes through the bus bar 110 can be reduced, the capacitors 72 and 74 can be prevented from deteriorating due to the increased temperature. Furthermore, the thickness of the current sensor 100 can be decreased in the direction in which the bus bar 110 and the circuit board 120 are laid side by side, whereby the current sensor 100 can be decreased in size and can be effectively mounted.

The capacitors 72 and 74 are disposed in an area other than the area between the bus bar 110 and the current sensing circuit. Hence, the distance between the bus bar 110 and the current sensing circuit can be shortened and voltage drop can be reduced therebetween, thereby increasing accuracy of current measurement. In addition, the capacitors 72 and 74 are disposed on one surface of the circuit board 120, that is, at the side at which the bus bar 110 is disposed. Hence, the increase of the thickness of the case 130 due to mounting the capacitors 72 and 74 can be prevented as much as possible.

It will be appreciated that the present invention is not limited to the configurations described above, but any and all modifications, variations or equivalents, which may occur to those who are skilled in the art, should be considered to fall within the scope of the present invention.

In the embodiment described above, the bus bar 110 and the resistor are integrated with each other. However, the bus bar 110 and the resistor may be separately provided.

In the embodiment described above, the current sensor 100 is attached to the negative terminal 202 of the battery 200 via the metal bracket 210. However, the current sensor 100 may be directly attached to the negative terminal 202 in a state, for example, where the first fixed part 112 of the current sensor 100 is elongated.

In the embodiment described above, the current sensor 100 is disposed so as to be perpendicular to the ground. However, the current sensor 100 may be disposed so as to be parallel to the ground or not to be parallel to the ground. In the embodiment described above, the case 130 housing the circuit board 120 has an internal space having a quadrilateral shape. However, the case 130 may have an internal space having another polygonal shape or the like.

In the embodiment described above, the capacitors 72 and 74 are disposed in an area other than the plane of projection of the energizing path of the bus bar 110. Furthermore, the capacitors 72 and 74 are preferably disposed at the position farthest from the energizing path on the circuit board 120 (e.g.

the area indicated by "B" in FIG. 4). According to the arrangement, the effects of the magnetic field, which is generated when a high current passes through the bus bar 110, on the capacitors 72 and 74 can be minimized. In addition, the effects of the temperature of the bus bar 110 increased when a high current passes through the bus bar 110 can also be minimized.

As described above, according to the embodiment, the capacitors 72 and 74 are disposed in an area other than the plane of projection of the energizing path of the bus bar 110. Hence, the effects of the magnetic field, which is generated when a high current passes through the bus bar 110, on the capacitors 72 and 74 can be reduced. In addition, reliability of the current sensor can be prevented from decreasing due to malfunction of the current sensing circuit or the like connected to the power supply circuit 70. Furthermore, since the effects of the temperature of the bus bar 110 being increased when a high current passes through the bus bar 110 can be reduced, the capacitors 72 and 74 can be prevented from deteriorating due to the increased temperature.

Hereinafter, aspects of the above-described embodiments will be summarized.

As an aspect of the embodiment, a current sensor, which senses current passing through a harness via a terminal of a battery, includes: a resistor through which current passes; a current sensing circuit which measures the current passing through the resistor based on a potential difference between two positions along the direction in which current is passed through the resistor; a power supply circuit which supplies power to the current sensing circuit; and at least one capacitor which is connected to at least one of an input terminal and an output terminal of the power supply circuit to smooth input/output voltage. The resistor includes a flat energizing path, and the capacitor is disposed in an area other than a plane of projection of the energizing path on a board on which the current sensing circuit and the power supply circuit are mounted.

The capacitor is disposed in an area other than the plane of projection of the energizing path of the resistor. According to this configuration, the effects of the magnetic field, which is generated when a high current passes through the resistor, on the capacitor can be reduced. Reliability of the current sensor can be prevented from decreasing due to malfunction of the current sensing circuit or the like connected to the power supply circuit. In addition, since the effects of the temperature of the resistor being increased when a high current passes through the resistor can be reduced, the capacitor can be prevented from deteriorating due to the increased temperature. Furthermore, the thickness of the current sensor can be decreased in the direction in which the resistor and is the board are laid side by side, whereby the current sensor can be decreased in size and can be effectively mounted.

The above capacitor is preferably disposed in an area other than an area between the resistor and the current sensing circuit. Accordingly, the distance between the resistor and the current sensing circuit can be shortened and voltage drop can be reduced therebetween, thereby increasing accuracy of current measurement.

The above capacitor is preferably disposed on a surface of the board and at the side at which the resistor is disposed. Accordingly, when the capacitor is mounted, the thickness of the current sensor can be decreased as much as possible in the direction in which the resistor and the board are laid side by side.

The above capacitor is preferably disposed at a position farthest from the resistor on the board. Accordingly, the effects of the magnetic field, which is generated when a high current passes through the resistor, on the capacitor can be minimized. In addition, the effects of the temperature of the resistor increasing when a high current passes through the resistor can also be minimized.

The above resistor preferably includes a portion in which the flat energizing path is turned. Accordingly, the projected area on the board can be decreased, thereby increasing flexibility of the arrangement of the capacitor.

What is claimed is:

1. A current sensor which senses current passing through a harness via a terminal of a battery, comprising:

a resistor through which current passes;

a current sensing circuit which measures the current passing through the resistor based on a potential difference between two positions along the direction in which current is passed through the resistor;

a power supply circuit which supplies power to the current sensing circuit; and at least one capacitor which is connected to at least one of an input terminal and an output terminal of the power supply circuit to smooth input/output voltage, wherein the resistor includes a flat energizing path, and the capacitor is disposed in an area other than a plane of projection of the energizing path on a board on which the current sensing circuit and the power supply circuit are mounted.

2. The current sensor according to claim 1, wherein the capacitor is disposed in an area other than an area between the resistor and the current sensing circuit.

3. The current sensor according to claim 1, wherein the capacitor is disposed on a surface of the board and at the side at which the resistor is disposed.

4. The current sensor according to claim 1, wherein the capacitor is disposed at a position farthest from the resistor on the board.

5. The current sensor according to claim 1, wherein the resistor includes a portion in which the energizing path is turned.

* * * * *